United States Patent
Gyotoku et al.

(10) Patent No.: US 8,462,964 B2
(45) Date of Patent: Jun. 11, 2013

(54) RECORDING APPARATUS, RECORDING METHOD, AUDIO SIGNAL CORRECTION CIRCUIT, AND PROGRAM

(75) Inventors: Kaoru Gyotoku, Kanagawa (JP); Takaaki Hashimoto, Kanagawa (JP)

(73) Assignee: Sony Corporation (JP)

( * ) Notice: Subject to any disclaimer, the term of this patent is extended or adjusted under 35 U.S.C. 154(b) by 367 days.

(21) Appl. No.: 12/658,928

(22) Filed: Feb. 17, 2010

(65) Prior Publication Data
US 2010/0220872 A1    Sep. 2, 2010

(30) Foreign Application Priority Data
Feb. 27, 2009    (JP) ................. P2009-047031

(51) Int. Cl.
*H03G 5/00*    (2006.01)

(52) U.S. Cl.
USPC ............ 381/101; 381/104; 381/103; 381/98; 381/107

(58) Field of Classification Search
USPC ............. 381/101–104, 106–107, 98
See application file for complete search history.

(56) References Cited

U.S. PATENT DOCUMENTS

| | | | |
|---|---|---|---|
| 6,072,879 A * | 6/2000 | Ouchi et al. | 381/61 |
| 2007/0291960 A1 * | 12/2007 | Sekiguchi | 381/107 |
| 2008/0008336 A1 * | 1/2008 | Tanaka et al. | 381/104 |

FOREIGN PATENT DOCUMENTS

| | | |
|---|---|---|
| JP | 05-161101 A | 6/1993 |
| JP | 2002158620 A | 5/2002 |
| JP | 2005210180 A | 8/2005 |
| JP | 2006173918 A | 6/2006 |
| JP | 2008312002 A | 12/2008 |

OTHER PUBLICATIONS

Office Action from Japanese Application No. 2009-047031, dated Feb. 22, 2011.

* cited by examiner

*Primary Examiner* — Disler Paul
(74) *Attorney, Agent, or Firm* — Lerner, David, Littenberg, Krumholz & Mentlik, LLP

(57) ABSTRACT

Disclosed herein is a recording apparatus including: an audio signal correction block configured to execute correction for flattening the frequency characteristic of an audio signal supplied from a microphone and/or correction of the level of the audio signal; a correction control block configured to make the audio signal correction block adjust the level of the audio signal attenuate the reference value with time, and, if an audio signal with a level thereof exceeding the reference value is entered, use the absolute value of the level of the audio signal exceeding the reference value as a new reference value; and a recording block configured to record the audio signal to a recording media.

7 Claims, 8 Drawing Sheets

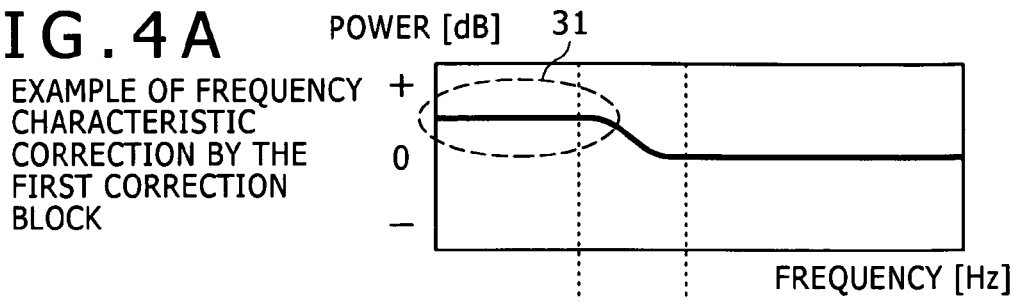

FIG. 4A EXAMPLE OF FREQUENCY CHARACTERISTIC CORRECTION BY THE FIRST CORRECTION BLOCK

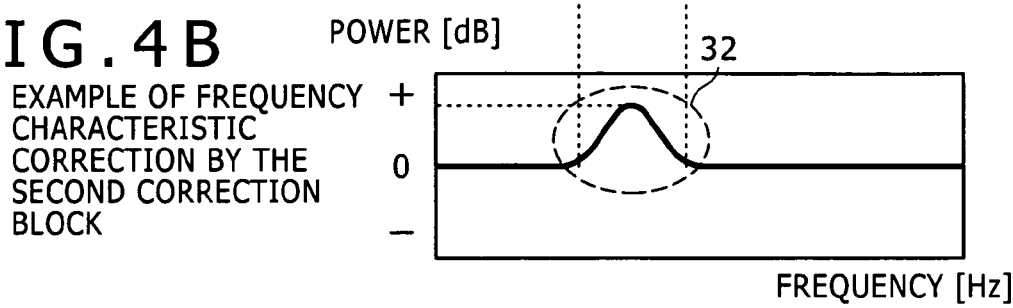

FIG. 4B EXAMPLE OF FREQUENCY CHARACTERISTIC CORRECTION BY THE SECOND CORRECTION BLOCK

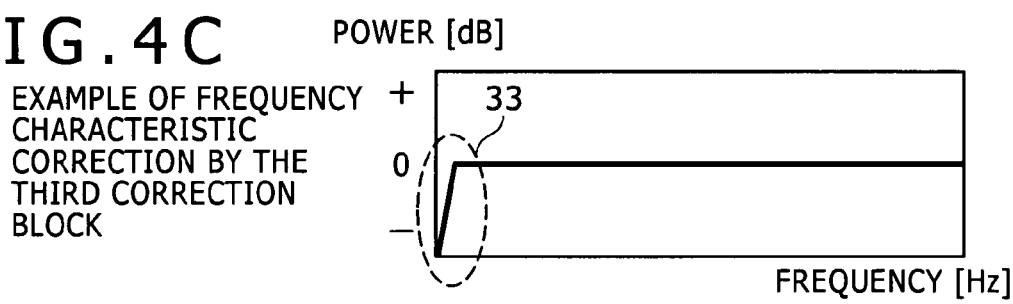

FIG. 4C EXAMPLE OF FREQUENCY CHARACTERISTIC CORRECTION BY THE THIRD CORRECTION BLOCK

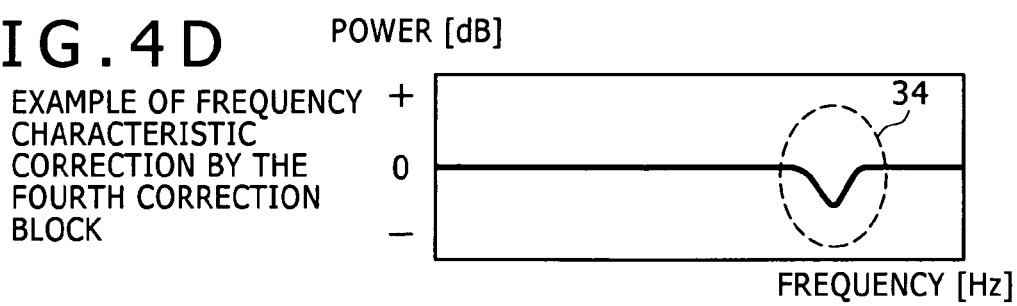

FIG. 4D EXAMPLE OF FREQUENCY CHARACTERISTIC CORRECTION BY THE FOURTH CORRECTION BLOCK

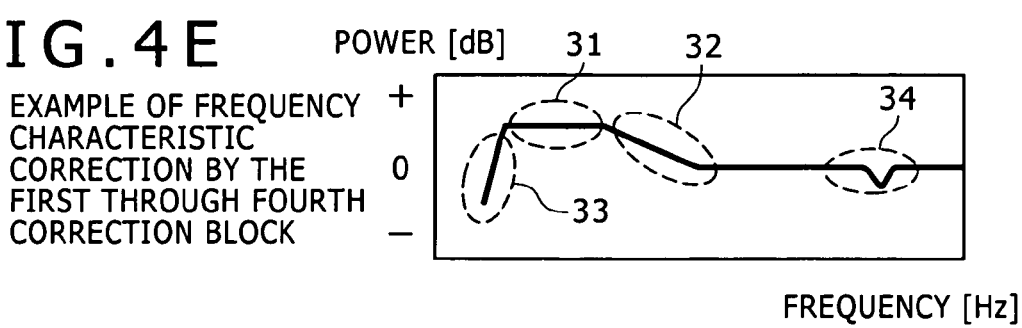

FIG. 4E EXAMPLE OF FREQUENCY CHARACTERISTIC CORRECTION BY THE FIRST THROUGH FOURTH CORRECTION BLOCK

EXAMPLES OF FREQUENCY CHARACTERISTIC CORRECTION

EXAMPLE OF FREQUENCY
CHARACTERISTIC OF
AUDIO SIGNAL BEFORE
CORRECTION

EXAMPLE OF FREQUENCY
CHARACTERISTIC OF
AUDIO SIGNAL AFTER
CORRECTION

EXAMPLES OF FREQUENCY CHARACTERISTICS OF AUDIO SIGNAL
BEFORE AND AFTER CORRECTION

EXAMPLE OF RECORDING MODES

EXAMPLE OF SIGNAL LEVEL OF INPUT AUDIO SIGNAL

EXAMPLE OF DICTATION MODE OR CONFERRENCE MODE

EXAMPLE OF MUSIC MODE

EXAMPLES OF RECORDING MODE

EXAMPLE OF MATCHING THE SIGNAL LEVEL OF DIGITAL AUDIO SIGNAL TO TARGET LOWER LIMIT VALUE

EXAMPLE OF MATCHING THE SIGNAL LEVEL OF DIGITAL AUDIO SIGNAL TO A RANGE OF TARGET LEVEL UPPER LIMIT VALUE AND LOWER LIMIT VALUE

EXAMPLE OF MAKING CONSTANT THE ATTENUATION AMOUNT OF STANDARD VALUE FROM THE MAXIMUM VALUE OF SIGNAL LEVEL

EXAMPLE OF VARYING THE ATTENUATION AMOUNT OF STANDARD VALUE IN ACCORDANCE WITH THE MAXIMUM VALUE OF SIGNAL LEVEL

EXAMPLE OF SIGNAL
LEVEL OF LEFT CANNEL

EXAMPLE OF SIGNAL
LEVEL OF RIGHT CANNEL

EXAMPLES OF VARYING SIGNAL LEVEL BY COMPARING
SIGNAL LEVELS FOR EACH CHANNEL

RECORDING APPARATUS, RECORDING METHOD, AUDIO SIGNAL CORRECTION CIRCUIT, AND PROGRAM

CROSS-REFERENCE TO RELATED APPLICATION

The present application claims priority from Japanese Patent Application No. JP 2009-047031 filed in the Japanese Patent Office on Feb. 27, 2009, the entire content of which is incorporated herein by reference.

BACKGROUND OF THE INVENTION

1. Field of the Invention

The present invention relates to a recording apparatus, a recording method, an audio signal correction circuit, and a program that are suitably applicable to the correction of audio signals (or voices) in accordance with environments of conference rooms and halls for example.

2. Description of the Related Art

Small-size recording apparatuses have been in use for recording the contents of meetings and lectures for example. Such recording apparatuses each have a small-sized microphone, a DSP (Digital Signal Processor), and so on for example. And, by use of AGC (Automatic Gain Control), these recording apparatuses perform predetermined processing on audio signals in accordance with recording modes. Then, because an AGC coefficient for changing AGC is set by use of a fixed constant, users manually correct the frequency characteristic of the microphone.

Japanese Patent Laid-Open No. Hei 5-161101 discloses a technique for linking signal levels so as to provide audio characteristics suitable for outdoor or indoor image taking conditions.

SUMMARY OF THE INVENTION

It should be noted that unidirectional microphones incorporated in related-art recording apparatuses are each of a relatively small diameter and, in general, the frequency characteristics of these microphones have a relatively low response in the low frequency range. In conferences for example, a relatively low response lower in band than the voice band may suppress the level of unwanted components such as a fan noise generated by a projector for example, thereby relatively making it easier to hear voice.

However, in the case of recording musical instruments for example, a flat frequency characteristic is required over a wide band, so that the low frequency range of the recorded voice may run short. Hence, scenes that can be recorded with proper characteristics may be restricted.

In addition, in the case of conferences for example, voice of relatively small volume is amplified by AGC to a proper easy-to-hear volume and compressed to a certain volume. On the other hand, in the case of music, an intonation of volume is required; but, with related-art recording apparatuses, even a sound as small as silence is automatically amplified, thereby making it easy to record with a volume that is flat overall.

Therefore, the present invention addresses the above-identified and other problems associated with related-art methods and apparatuses and solves the addressed problems by providing a recording apparatus, a recording method, an audio signal correction circuit, and a program that are configured to correct audio signals with frequency characteristics and signal levels suitable for environment.

In carrying out the invention and according to one embodiment thereof, there is provided a recording apparatus including: an audio signal correction block configured to execute correction for flattening the frequency characteristic of an audio signal supplied from a microphone and/or correction of the level of the audio signal on the basis of a recording mode in which correction amounts of the frequency characteristic and the level of the audio signal are defined; a correction control block configured, if, on the basis of a lower limit value and an upper limit value of a target value predetermined for the recording mode, the level of the audio signal is lower than the lower limit value of the target value, to make the audio signal correction block adjust the level of the audio signal so as for the level of the audio signal to exceed the lower limit value of the target value, if the level of the audio signal is over the upper limit value of the target value, make the audio signal correction block adjust the level of the audio signal so as for the level of the audio signal to go below the upper limit value of the target value, by use of an absolute value of the level of the audio signal that is maximized in a predetermined period as a reference value, attenuate the reference value with time, and, if an audio signal with a level thereof exceeding the reference value is entered, use the absolute value of the level of the audio signal exceeding the reference value as a new reference value; and a recording block configured to record the audio signal to a recording media.

In this manner, the recording apparatus according to an embodiment of the present invention is able to adjust the level of audio signals properly in accordance with recording modes specified by the user thereby correcting the frequency characteristics of the audio signals.

According to an embodiment of the present invention, the user can select recording modes in accordance with the scenes in which recording is conducted and have the frequency characteristics and the levels of the audio signals corrected on the basis of the selected recording mode. Thus, it is advantageous that the recording apparatus according to the embodiment of the present invention can obtain audio signals with the frequency characteristics suitable for environments and the optimum level thereby making it easier for the user to obtain audio signal with desired sound quality.

BRIEF DESCRIPTION OF THE DRAWINGS

FIGS. 4A, 4B, 4C, 4D, and 4E are diagrams for explaining examples of frequency characteristics correction in the above-mentioned embodiment;

DETAILED DESCRIPTION OF THE PREFERRED EMBODIMENTS

This invention will be described in further detail by way of embodiments thereof with reference to the accompanying drawings. The description will be made in the following order:

(1) One embodiment of the present invention (the correction of frequency characteristics and signal levels of an audio signal; examples in which the frequency characteristics of an audio signal is flattened to bring the signal levels to a range of target levels).

(2) Variations to the above-mentioned embodiment.

(1) One embodiment of the present invention

[Exemplary Internal Configuration of a Recording Apparatus]

The following describes one embodiment of the present invention with reference to FIGS. 1 through 10. With this embodiment, an example in which the embodiment is applied to a recording apparatus 1 configured to correct a level of an audio signal to be recorded in accordance with a predetermined recording mode is described.

Figure 1:
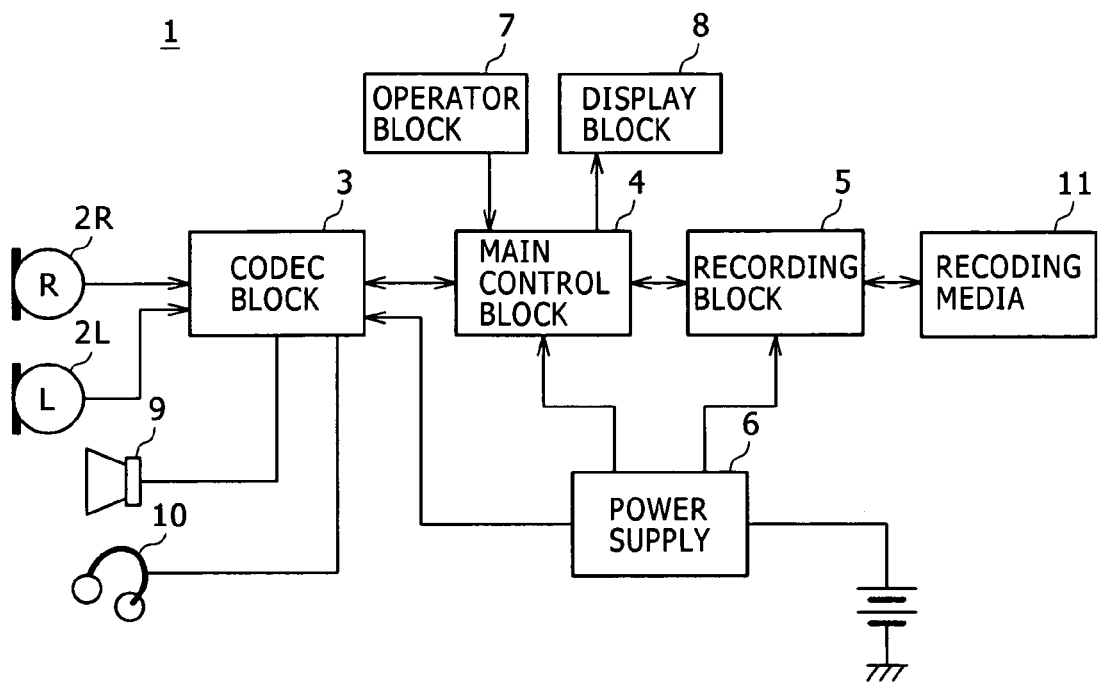
FIG. 1 is a block diagram illustrating an exemplary internal configuration of a recording apparatus practiced as one embodiment of the present invention.

Now, referring to FIG. 1, there is shown an exemplary internal configuration of the recording apparatus 1 of this example.

The recording apparatus 1 has microphones 2R, 2L for generating analog audio signals of two right and left channels and a codec block 3 for converting the analog audio signals into a predetermined digital format. For the format with which the codec block is compliant, linear PCM (Pulse Code Modulation) is used, for example.

In addition, the recording apparatus 1 has a main control block 4 for correcting the signal level and frequency characteristic of a digital audio signal supplied from the codec block 3 in accordance with a predetermined recording mode and a recording block 5 for recording the digital audio signal with the signal level and frequency characteristic corrected to a recording media 11. For the main control block 4, a system LSI is used for example. For the recording media 11, a flash memory is used for example. In what follows, parameters for specifying a correction amount of the frequency characteristic and level of each audio signal are referred to as "recording mode." In the present example, five types of recording modes are provided as will be described later.

Further, the recording apparatus 1 has an operator block 7 through which a user can set recording modes as desired and a display block 8 on which a set recording mode is displayed and information that recording is on is displayed, for example. The operator block 7 has key buttons for example. The display block 8 is based on a liquid crystal display panel for example.

Still further, the recording apparatus 1 has the codec block 3 and a power supply block 6 for supplying power to the main control block 4 and the recording block 5. Besides, the recording apparatus 1 has a loudspeaker 9 for sounding audio signals (or voices) and an earphone 10. The codec block 3 converts a digital audio signal into an analog audio signal and supplies the analog audio signal to the loudspeaker 9 and the earphone 10 via an amplifier, not shown. Consequently, the loudspeaker 9 and the earphone 10 are able to sound the audio signal. It should be noted that the recording apparatus 1 is able to not only read digital audio signals from the recording block 5 but also make the loudspeaker 9 and earphone 10 sound audio signals realtime without through the recording block 5.

[Exemplary Internal Configuration of the Main Control Block]

Figure 2:
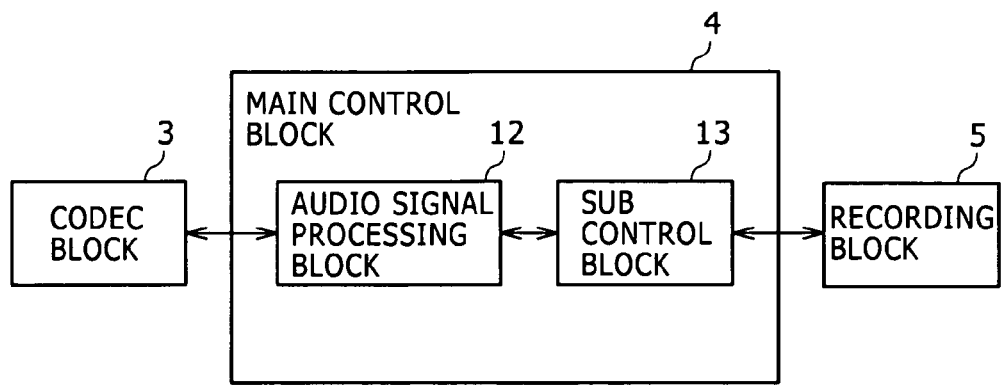
FIG. 2 is a block diagram illustrating an exemplary internal configuration of a main control block in the above-mentioned embodiment.

Referring to FIG. 2, there is shown an exemplary internal configuration of the main control block 4.

The main control block 4 has an audio signal processing block 12 for adjusting the level and frequency characteristic of each digital audio signal supplied from the codec block 3. In addition, the main control block 4 has a sub control block 13 for recording digital audio signals to the recording media 11 via the recording block 5 and reading digital signals from the recording media 11 via the recording block 5.

The audio signal processing block 12 is based on DSP (Digital Signal Processing), for example. The sub control block 13 is based on CPU (Central Processing Unit), for example. The audio signal processing block 12 is able to change AGC coefficients and filter coefficients to properly process audio signals in accordance with recording modes. Further, the audio signal processing block 12 is able to data-compress processed audio signals by use of encoder processing such as MP3, for example.

[Exemplary Internal Configuration of the Audio Signal Processing Block]

Figure 3:
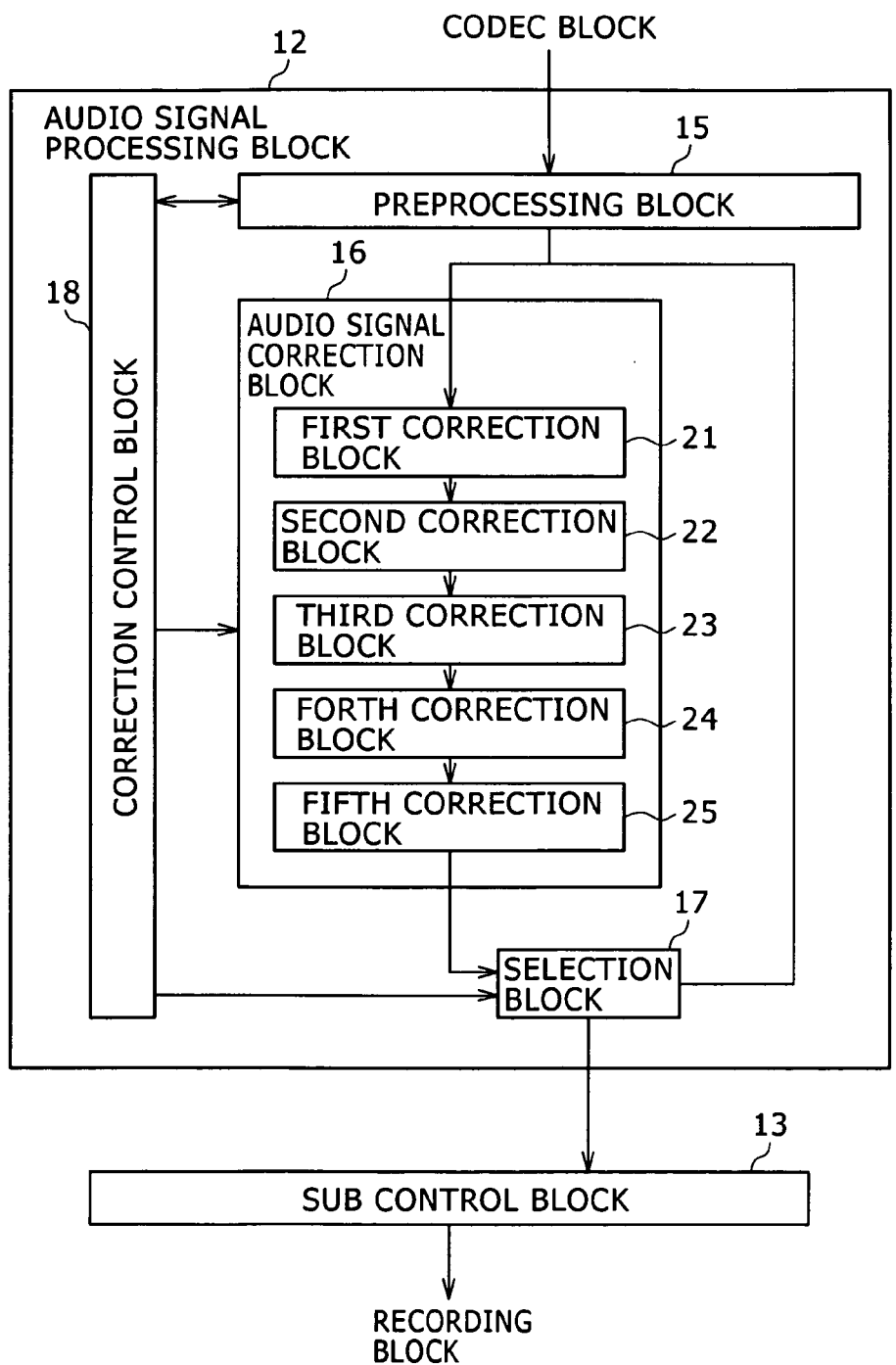
FIG. 3 is a block diagram illustrating an exemplary internal configuration of an audio signal correction block in the above-mentioned embodiment.

Referring to FIG. 3, there is shown an exemplary internal configuration of the audio signal processing block 12.

The audio signal processing block 12 is a block incorporated in the recording apparatus 1 as an audio signal correction circuit. The audio signal processing block 12 has a preprocessing block 15 for executing preprocessing on digital audio signals and an audio signal correction block 16 for correcting the frequency characteristic of a digital audio signal to a proper frequency characteristic and/or correcting the level of an audio signal in accordance with a set recording mode.

Further, the audio signal processing block 12 has a selection block 17 for supplying digital audio signals to the sub control block 13. The selection block 17 selects a digital audio signal with the frequency characteristic and signal level thereof adjusted via the audio signal correction block 16 or a digital audio signal that is not processed at all and outputs the selected digital audio signal. The selection block 17 also adjusts the volume at the time of recording mode switching as a fader.

Also, the audio signal processing block 12 has a correction control block 18 for executing predetermined control operations on the preprocessing block 15, the audio signal correction block 16, and the selection block 17. Control operations by the correction control block 18 depend on mainly on/off of recording modes that are switched by an input operation done through the operator block 7 or recording mode types.

The audio signal correction block 16 corrects the frequency characteristics of audio signals supplied from the microphones 2R, 2L to proper frequency characteristics and/or corrects the levels of the audio signals on the basis of a recording mode in which correction amounts of the frequency characteristic and level of audio signals are specified.

The audio signal correction block 16 has a first correction block 21 through a fourth correction block 24 for correcting a predetermined frequency characteristic and a fifth correction block 25 for increasing or decreasing the signal level of a digital audio signals in according with a set recording mode. An example of frequency characteristics to be corrected by the first correction block 21 through the fourth correction block 24 will be described later with reference to FIGS. 4A to 4E. An example of the signal level of a digital audio signal to be corrected by the fifth correction block 25 will be described later with reference to FIG. 6A through FIG. 10.

On the basis of the lower limit value and the upper limit value of a target level determined for each recording mode, if the level of an audio signal is below the lower limit value of the target level, the correction control block 18 makes the audio signal correction block 16 adjust the level of the audio signal so as to raise the level of the audio signal over the lower limit value of the target level. On the other hand, if the level of an audio signal is over the upper limit value of the target level, the correction control block 18 makes the audio signal correction block 16 adjust the level of the audio signal so as to lower the level of the audio signal below the upper limit value of the target level. Then, with the absolute value of the level of the audio signal that is maximized during a predetermined period used as a reference value, the correction control block 18 attenuates the reference value in accordance with the passing of time. Subsequently, if an audio signal with the level thereof exceeding the reference value is entered, the correction control block 18 uses the absolute value of the level of the audio signal exceeding the reference value as a new reference value.

Referring to FIGS. 4A to 4E, there are shown examples of frequency characteristics to be corrected by the first correction block 21 through the fourth correction block 24. In what follows, FIGS. 4A to 4E and FIGS. 5A and 5B show examples of frequency characteristics correction with the horizontal axis representing frequency (Hz) and the vertical axis representing power (dB) for each of the first correction block 21 through the fourth correction block 24.

FIG. 4A shows an example of a frequency characteristic to be corrected by the first correction block 21.

The first correction block 21 has a function of lifting the signal level of the frequency characteristic (lower range) of a sound range 31. The first correction block is based on an IIR (Infinite Impulse Response) bass shelving filter, for example.

FIG. 4B shows an example of a frequency characteristic to be corrected by the second correction block 22.

The second correction block 22 has a function of finely adjusting the frequency characteristic (medium range) of a sound range 32 by increasing or decreasing the signal level. The second correction block 22 is based on an IIR equalizer filter, for example.

FIG. 4C shows an example of a frequency characteristic to be corrected by the third correction block 23.

The third correction block 23 has a function of cutting the signal level of a frequency characteristic (ultra low range below audible range) of a sound range 33. Consequently, an unwanted very narrow lower range causing noise is cut. The third correction block 23 is based on an IIR highpass filter, for example.

FIG. 4D shows an example of a frequency characteristic to be corrected by the fourth correction block 24.

The fourth correction block 24 has a function of finely adjusting the signal level of a frequency characteristic (higher range) of a sound range 34. The fourth correction block 24 is based on an IIR equalizer filter, for example.

FIG. 4E shows an example of a frequency characteristic to be corrected by the first correction block through the fourth correction block 24. The first correction block 21 through fourth correction block 24 respectively execute frequency characteristic correction on the sound range 31 through 34 shown in the figures.

Figure 5A:
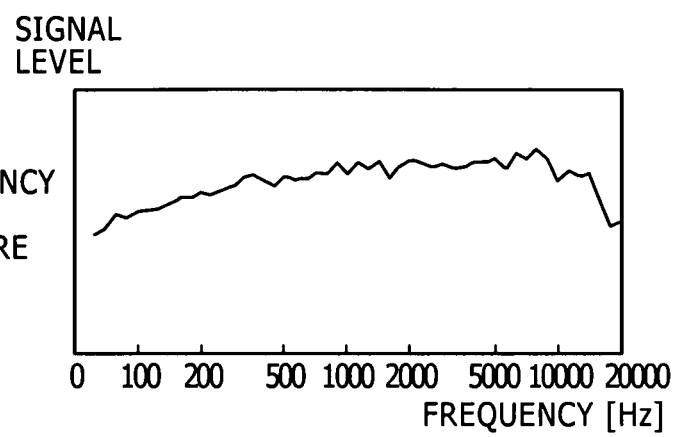
FIGS. 5A and 5B are diagrams for explaining examples of frequency characteristics of audio signals before and after correction in the above-mentioned embodiment.
Figure 5B:
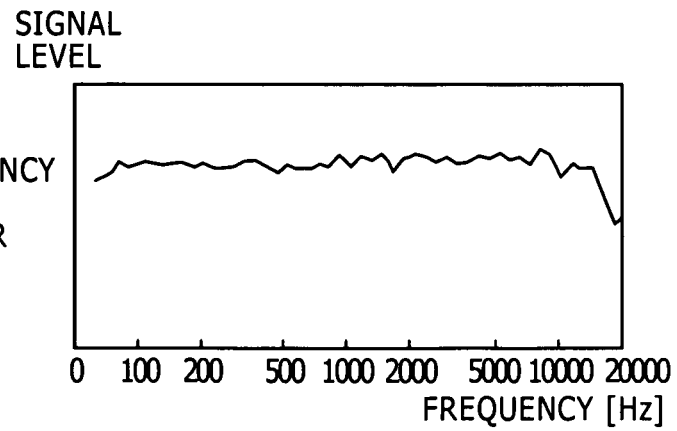

Referring to FIGS. 5A and 5B, there are shown examples of frequency characteristics of audio signals before and after correction.

FIG. 5A shows an example of the frequency characteristic of an audio signal before correction.

At this time, the signal level of a digital audio signal entered in the audio signal processing block 12 is not uniform for each frequency, so that, at the time of sounding, the audio signal may be heard short of the lower range.

FIG. 5B shows an example of the frequency characteristic of an audio signal after correction.

The first correction block 21 through the fourth correction block 24 arranged in the audio signal correction block 16 cut unwanted very low band from each audio signal to flatten the signal level of the digital audio signal in the audible range, thereby allowing the user to hear the audio signal at the time of sounding in a substantially equal state to that the audio signal was entered through the microphones.

Referring to FIGS. 6A to 6D, there is shown an example of a recording mode that is set in the recording apparatus 1.

Figure 6A:
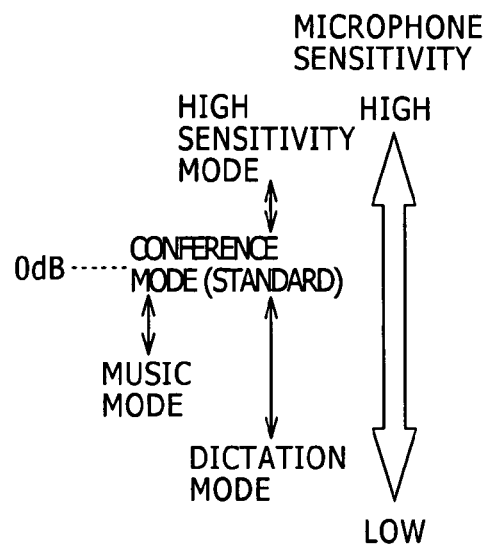
FIGS. 6A, 6B, 6C, and 6D are diagrams indicative of recording mode examples in the above-mentioned embodiment.

FIG. 6A shows an example of a recording mode.

In order to change the recording sensitivity of the microphones 2R, 2L, the recording apparatus 1 of the present embodiment prepares two or more recording modes. There provided the following recording modes. In a first recording mode, the reference of sensitivity is provided while maintaining a state in which the frequency characteristic of an audio signal was picked up by the microphones 2R, 2L. In a second recording mode, the sensitivity of the microphones 2R, 2L is raised over that of the first recording mode. In a third recording mode, the sensitivity of the microphones 2R, 2L is lowered below that of the first recording mode. In a fourth recording mode, the level of an audio signal is corrected while the frequency of the audio signal is corrected to a characteristic suitable for a recording scene by filter processing. Then, one of the first through fourth recording modes is selected by the user.

To be more specific, the recording apparatus 1 prepares five types of recording modes (conference mode, high sensitivity mode, dictation mode, music mode, and manual mode). Because the sensitivity of the microphones 2R, 2L differs from one recording mode to another, the fifth correction block 25 adjusts the signal level of a digital audio signal for each recording mode.

The conference mode is suitable for the recording of conversations in a conference room or the like, which applies to the above-mentioned first recording mode. At this time, the sensitivity of the microphones 2R, 2L is medium, providing a reference signal level for the other recording modes.

The high sensitivity mode has a function of recording a small sound by amplifying, which applies to the above-mentioned second recording mode. The high sensitivity mode is suitable for situations in which a sound to be recorded in the conference mode is small or a meeting is sound in a large conference room without using PA (Public Address) facilities.

The dictation mode has a function of automatically adjusting the signal level at the time recording so as to maintain substantially the same volume as far as possible, which applies to the above-mentioned third recording mode.

The music mode has a function of recording the playing musical instruments or the like in which a frequency characteristic is corrected to be flatter than voice over a wide band and without impairing sound intonation so as not to cause a feeling of strangeness. The music mode applies to the above-mentioned fourth recording mode. When music is recorded with any of the other modes set, the sound intonation may be lost to provide a flat sound. Also, depending on a musical instrument to be recorded, the sound may be recorded with quaver. Therefore, this music mode dedicated to the recording of the playing of musical instruments or the like is provided.

The manual mode is used to change the gain (amplification ratio) of the microphones 2R, 2L according to user preference without regard to the other recording modes. When the user executes manual setting by the manual mode, the recording in proportion to the input is executed.

Figure 6B:
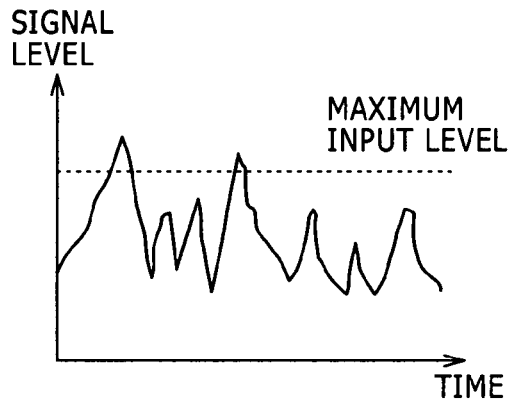

FIG. 6B shows an example of the signal level of a digital audio signal that is entered in the audio signal processing block 12.

Normally, the signal level of a digital audio signal that can be processed by the recording apparatus 1 is inside a range of a predetermined threshold value. In the present embodiment, the upper limit of each signal level is indicated as a maximum input level.

The signal level of a digital audio signal that is entered in the audio signal processing block 12 without being processed may exceed the maximum input level. Such a digital audio signal may cause a distortion at the time of sounding.

Figure 6C:
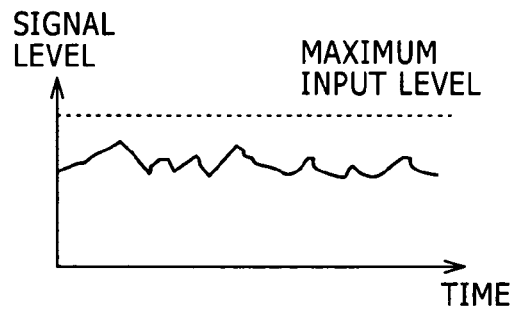

FIG. 6C shows an example of the signal level of a digital audio signal in the case where the recording mode is set to the dictation mode or the conference mode.

In this case, the signal level of a digital audio signal is corrected almost uniformly. Namely, a small sound is raised in signal level and a large sound is lowered in signal level. And, an overall signal level is corrected such that the maximum input level is not exceeded.

Figure 6D:
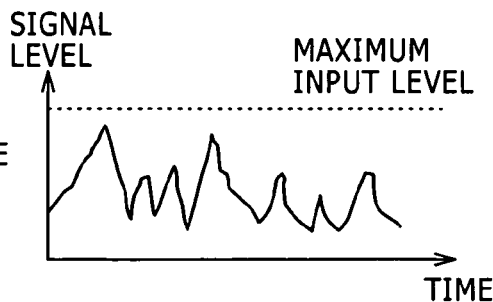

FIG. 6D shows an example of the signal level of a digital audio signal in the case where the recording mode is set to the music mode.

In this case, the signal level of a digital audio signal is corrected by narrowing the overall range with the intonation maintained to a certain degree. Hence, a small sound remains low in signal level and a large sound remains high in signal level. And, the overall signal level is corrected such that the maximum input level is not exceeded.

Figure 7:
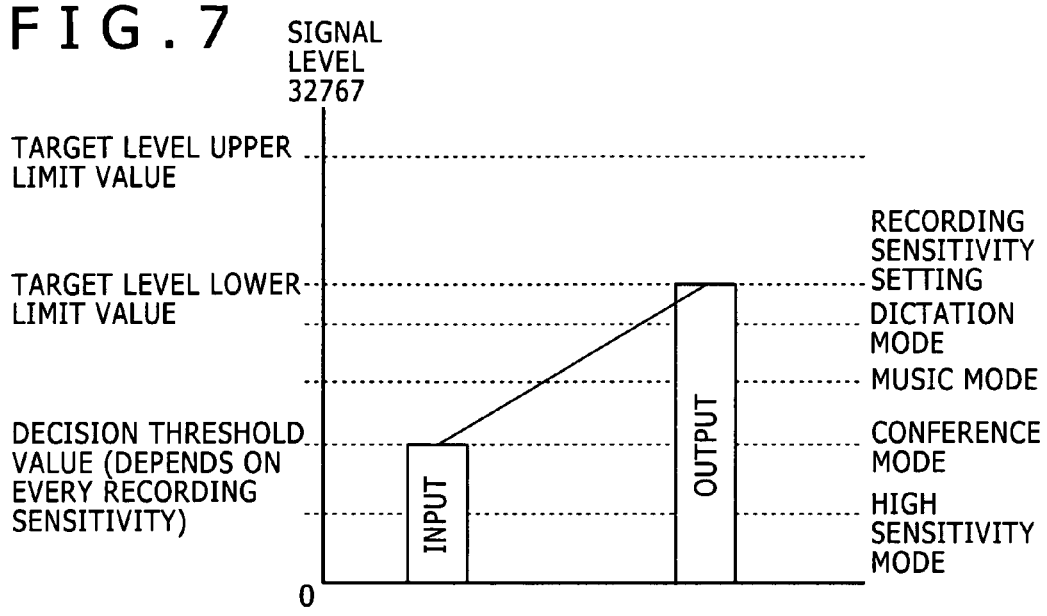
FIG. 7 is a diagram indicative of an example in which a signal level of an audio signal is matched with a target level lower limit value in the above-mentioned embodiment.

Referring to FIG. 7, there is shown an example in which the signal level of a digital audio signal is matched with a target level lower limit value.

The target level for bringing the signal level of a digital audio signal into a predetermined range is specified as a target level lower limit value and a target level upper limit value.

If the signal level of a digital audio signal that is entered in the audio signal processing block 12 exceeds a decision threshold value that is set for each recording mode, the output signal level is adjusted to be brought between the target level lower limit value and the target level upper limit value by use of the following equations.

$$a0 = (\text{target upper limit value} - \text{target lower limit value})/(\text{maximum level} - \text{decision threshold value}) \quad (1)$$

$$b0 = \text{target upper limit value} - (a0 \times \text{decision threshold value}) \quad (2)$$

$$\text{Output signal level} = ((a0 \times \text{reference value} + b0)/\text{reference value}) \times \text{input signal level} \quad (3)$$

On the other hand, for signals equal to or below the decision threshold value, signal amplification is executed by use of the following equation.

$$\text{Output signal level} = (\text{target lower limit value}/\text{decision threshold value}) \times \text{input signal level} \quad (4)$$

However, if the signal level does not satisfy the decision threshold value set for each recording mode, the signal level correction is not executed.

Figure 8:
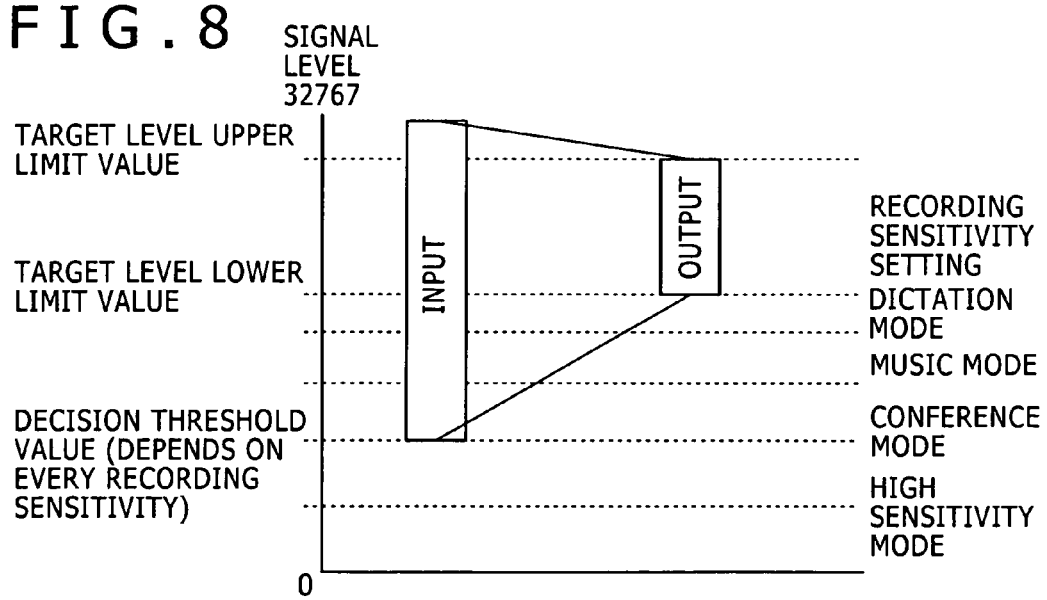
FIG. 8 is a diagram indicative of an example in which a signal level of an audio signal is matched with a range of a target level upper and lower limit values.

Referring to FIG. 8, there is shown an example in which the signal level of a digital audio signal is matched with a range of the target level upper limit value and the target level lower limit value. A decision threshold value is set in the same manner as shown in FIG. 7.

Here, a situation is assumed that a range of the signal level of a digital audio signal that is entered in the audio signal processing block 12 exceeds the target level upper limit value or does not satisfy the target level lower limit value. At this time, the fifth correction block 25 outputs the signal level by limiting to the range of the target level lower limit value and the target level upper limit value.

Figure 9:
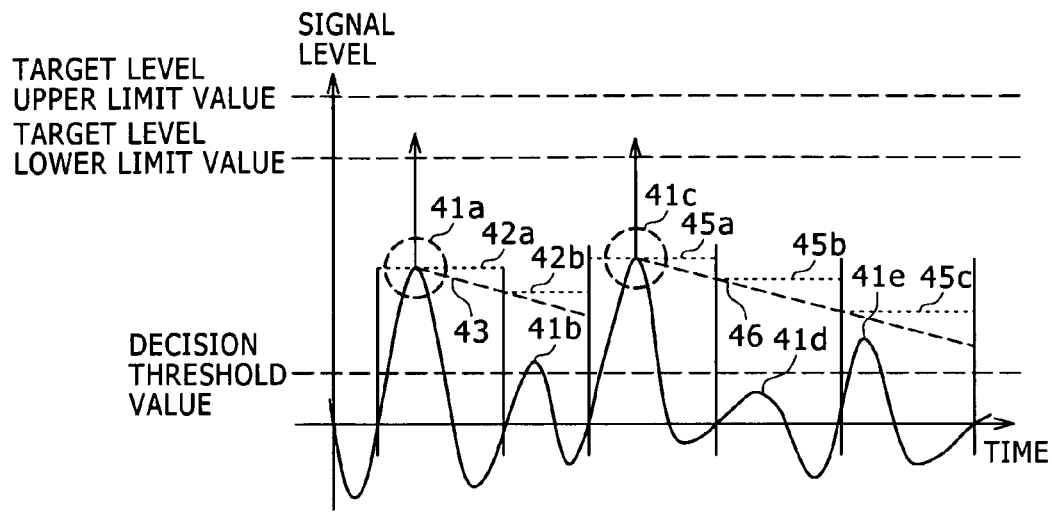
FIG. 9 is a diagram for explaining an example in which a reference value is changed with a constant attenuation amount from a maximum value of a signal level in the above-mentioned embodiment.

Referring to FIG. 9, there is shown an example in which reference values are changed with a certain attenuation amount from the maximum value of the signal level of a digital audio signal that is entered in the audio signal processing block 12.

The following describes "reference value."

FIG. 9 shows reference values 42a, 42b, and 45a through 45c. The fifth correction block 25 uses, as a reference value 42a, the absolute value (peak 41a) of the digital audio signal of the maximum level entered during a predetermined period (one period). At this time, the fifth correction block 25 computes the multiplication of the peak 41a (the reference value 42a) that brings the signal level into the range of the target level upper limit value and the target level lower limit value. Then, the fifth correction block 25 computes, as "multiplication parameter," a parameter indicative of a multiplication of the peak 41a (the reference value 42a).

The fifth correction block 25 multiplies the signal level of the entered digital audio signal by "multiplication parameter" to correct the signal level such that the signal level is brought into the range of the target level upper limit value and the target level lower limit value. In addition, the fifth correction block 25 constantly attenuates this reference value 42a with time. The attenuation amount for the reference value 42a is obtained by an attenuation line 43 having a predetermined inclination with the reference value 42a being a start value.

Now, a peak 41b next to the peak 41a will be examined. The peak 41b is lower than the reference value 42a. Therefore, the fifth correction block 25 directly applies the multiplication parameter obtained for the peak 41a to make correction by multiplying the signal level of the peak 41b by the multiplication parameter. Consequently, the signal level of the peak 41b is brought into the range of the target level upper limit value and the target level lower limit value.

When an audio signal having the maximum level exceeding the reference value 42b is entered, the fifth correction block 25 uses the absolute value (peak 41c) of this signal level as a new reference value 45a, thereby computing "multiplication parameter." Then, in accordance with an attenuation line 46, the fifth correction block 25 repeats the processing of attenuating the reference value 45a with time.

In what follows, a comparison is made between the signal level of a digital audio signal to be entered and the reference value for each period; if the signal level is higher than the reference value, the processing of resetting this signal level on the basis of the reference value is repeated.

Thus, the reference value for signal level adjustment is determined for each predetermined period. And, an attenuation amount per predetermined time of the reference value is constant as indicated by the attenuation lines 43, 46. Hence, if a person utters in a relatively large voice at a conference, for example, the reference value is set high. Then, another person utters in a small voice, the reference value is lowered. Consequently, regardless of speaker's voice magnitude, the signal level can be properly corrected into the range of the target level upper limit value and the target level lower limit value.

Figure 10:
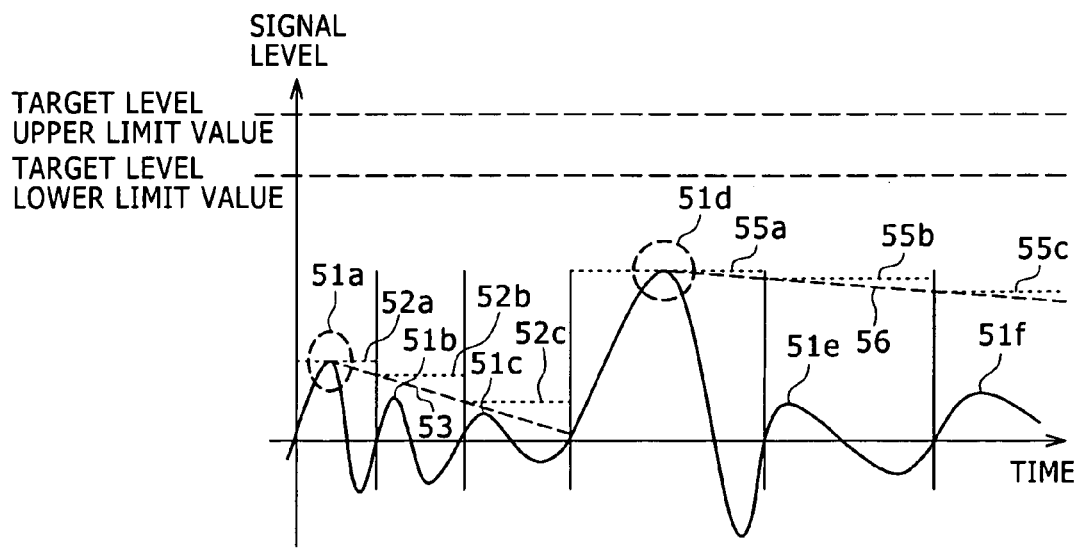
FIG. 10 is a diagram for explaining an example in which a reference value is changed by changing an attenuation in accordance with a maximum value of a signal level in the above-mentioned embodiment.

Referring to FIG. 10, there is shown an example in which attenuation amounts are changed in accordance with the maximum value of a signal level during a predetermined period.

In a quite environment, the signal level of a digital audio signal tends to be low. For a low signal level, the fifth correction block 25 makes correction to raise the signal level to the range of the target level upper limit value and the target level lower limit value. In what follows, a time for gradually adjusting the correction amount by following the state of an input signal and raising the signal level of a digital audio signal to the range of the target level upper limit value and the target level lower limit value is referred to as "recovery time." The recovery time, to be described later, to be provided by the fifth correction block 25 varies in cooperation with the sensitivity of the microphones 2R, 2L to be set by a recording mode.

With related-art technologies, the recovery is constant regardless of signal levels. Hence, when a digital audio signal having a low signal level is entered, the signal level remains low at first, being gradually raised later. As a result, if a signal level suddenly changed from a proper state to a low level, a voice recorded immediately after the change tends to be small, thereby making the utterance unclear.

Therefore, the recording apparatus 1 (the fifth correction block 25) of the present embodiment is configured to change the recovery time in accordance with the signal level of a digital audio signal to be entered. To be more specific, the correction control block 18 makes an attenuation amount per a certain time of the reference value variable in accordance with the height of the level of an audio signal and makes the speed of the correction of the level of the audio signal to be executed by the audio signal correction block 16 (the fifth correction block 25) variable.

As shown in FIG. 10, the fifth correction block 25 computes a parameter indicative of the multiplying of the peak 51a (the reference numeral 52a) as "multiplication parameter."

Then, the fifth correction block 25 multiplies the signal level of an entered digital audio signal by "multiplication parameter" to correct the signal level to the range of the target level upper limit value and the target level lower limit value. Also, the fifth correction block 25 constantly attenuates this reference value 52a with time. The attenuation amount of the reference value 52a is obtained by an attenuation line 53 having a predetermined inclination with the reference value 52a being a start value.

Now, a peak 51b and a peak 51c next to the peak 51a will be examined. The peak 51b and the peak 51c are lower than the reference value 52a. Therefore, the fifth correction block 25 directly applies the reference value 52a to obtain the multiplication parameter and multiplies the signal levels of the peak 51b and peak 51c by the obtained multiplication parameter for correction. Consequently, the signal levels of the peak 51b and the peak 51c are brought into the range of the target level upper limit value and the target level lower limit value.

When an audio signal having the maximum level exceeding the reference value 52b is entered, the fifth correction block 25 uses the absolute value (peak 51d) of this signal level as a new reference value 55a, thereby computing "multiplication parameter." Then, in accordance with an attenuation line 56, the fifth correction block 25 repeats the processing of attenuating the reference value 55a down to reference values 55b, 55c with time.

In what follows, a comparison is made between the signal level of a digital audio signal to be entered and the reference value for each period; if the signal level is higher than the reference value, the processing of resetting this signal level on the basis of the reference value is repeated.

As shown in FIG. 10, when a voice having a small volume is entered, the time necessary for recovery is shortened. On the other hand, in the case of a voice having a large volume, the time necessary for recovery is made long so that AGC follows slowly. Consequently, the signal level of a digital audio signal having a small volume is quickly brought into the range of the target level upper limit value and the target level lower limit value, so that, in reproducing the digital audio signal, the user is able to clearly hear even if the signal level has quickly changed from a proper state to a low level. Also, when the signal level goes high, the time necessary for recovery is made long. Hence, the fifth correction block 25 is able to correct the signal level without frequently obtaining the multiplication parameter.

According to the recording apparatus 1 associated with one embodiment described above, the user is able to record voice to the recording apparatus 1 by selecting an optimum recording mode in accordance with a scene to be recorded. At this moment, the audio signal correction block automatically changes a filter coefficient predetermined for each recording mode so as to optimize correction filters of the first correction block 21 through the fourth correction block 24 for correcting the frequency characteristic of each digital audio signal. Then, in order to correct especially the low range among the frequency characteristics of the microphones 2R, 2L, the first correction block 21 through the fourth correction block 24 are able to correct the frequency characteristic of a digital audio signal to be recorded from low range to high range in a flat manner. It should be noted that, the correction of the low range may cause noise due to picking up a wind or the like. In such a case, the low range can be controlled by turning on/off the correction by setting a recording mode that does not use the low-range correction filter or by setting an LCF (Low Cut Filter).

Also, the fifth correction block 25 executes correction in accordance with the set recording mode, so as to the frequency characteristic of the microphones 2R, 2L becomes optimum in the use in which mainly voice is recorded in conference, dictation or the like and in the use in which instruments, natural sounds or the like are recorded. At this moment, in accordance with each of the uses, parameters such as filter coefficient of the microphones 2R, 2L, AGC coefficient, attack time, recovery time, and the like are set in supposedly optimum combinations, thereby providing an effect of making it easy to provide a recording condition intended by the user.

If the microphones 2R, 2L arranged on the recording apparatus 1 are small in size the frequency characteristic of an audio signal to be picked up can be flattened, thereby enabling the recording of digital audio signals with high sound quality. In addition, the user is able to set AGC coefficients in accordance with recording scenes by changing recording modes, thereby providing an effect of recording audio signals with natural sound.

2) Variations to the above-mentioned embodiment

It should be noted that the recording apparatus 1 associated with the above-mentioned embodiment corrects the frequency characteristic of a digital audio signal without making distinction between the microphones 2R, 2L to change signal level reference values; it is also practicable to relate the processing of the microphone 2R with the processing of the microphone 2L.

Figure 11A:
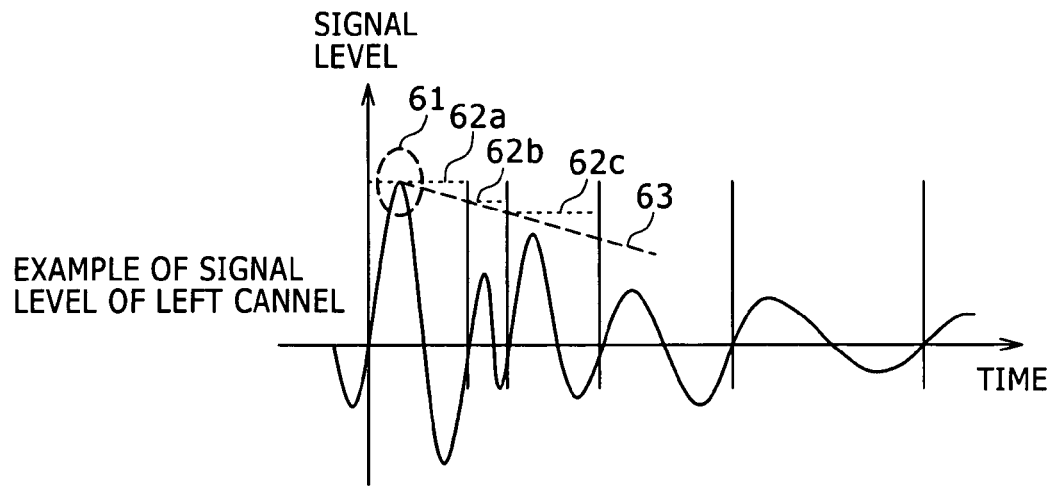
FIGS. 11A and 11B are diagrams indicative of an example in which signal levels are compared for the right and left channels to change the signal levels of right and left channels in another embodiment of the present invention.
Figure 11B:
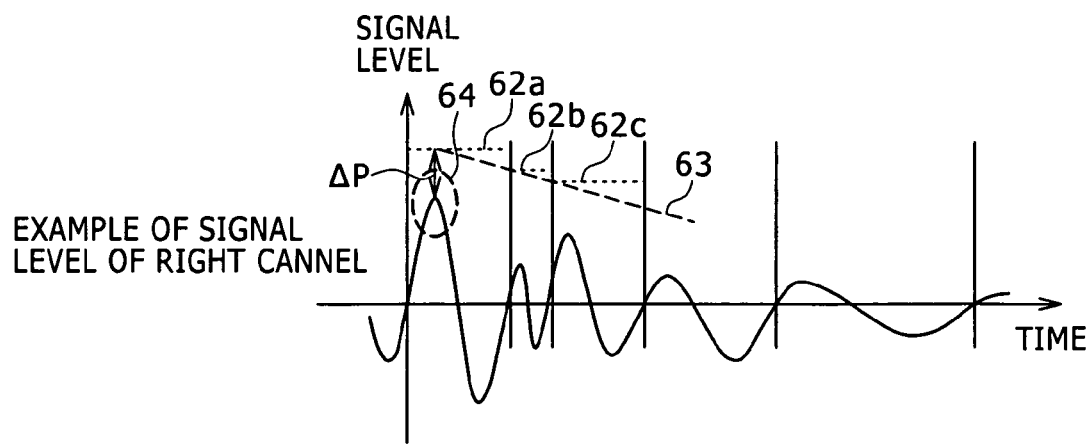

Referring to FIGS. 11A and 11B, there are shown examples in which signal levels are compared with each other for each channel to change the signal levels.

FIG. 11A shows an example of the signal level of a left-channel digital audio signal that is generated from an audio signal picked up by the microphone 2L.

FIG. 11B shows an example of a right-channel digital audio signal that is generated from an audio signal picked up by the microphone 2R.

Generally, the microphones 2R, 2L incorporated in the recording apparatus 1 are separated by a predetermined distance (about 2 cm for example), so that picked up audio signals have different intensities, resulting in different signal levels of digital audio signals on the left and right channels. Hence, the user can hear the sound recorded by the recording apparatus 1 in a stereo manner. The recording apparatus 1 of the present embodiment corrects the frequency characteristic and signal level of each digital signal while maintaining the stereo effect.

First, in the case where audio signals of two or more channels (two channels in the present embodiment) are supplied, the correction control block 18 makes a comparison between the signal levels of the digital audio signals of the left and right channels during a predetermined period for each channel. Next, the correction control block 18 sets a reference value 62a from a peak 61 of the channel (the left channel shown in FIG. 11A) having the higher signal level. Then, in accordance with an attenuation line 63, the fifth correction block 25 repeats the processing of the reference value 62a to attenuate to reference values 62b, 62c with time.

On the other hand, a maximum value (a peak 64) of the signal level of the digital signal on the channel (right channel shown in FIG. 11B) having the lower signal levels lower by LP than a maximum value (the peak 61) of the signal level of the digital audio signal having the higher signal level at the same time. In this case, if the signal level of the right channel is corrected so as to make the signal level of the right channel equal to the signal level of the left channel, the stereo effect will be lost despite the stereo recording. Hence, the signal level of the right channel is corrected in accordance with the reference value (signal levels 62a, 62b, and 62c) set by the signal level of the left channel.

If there is a difference between the signal levels of the digital audio signals on left and right channels, the recording apparatus 1 of the present embodiment applies the reference value set to the channel having the higher signal level also to the channel having the lower signal level. At this time, if audio signals of two or more channels are supplied, the correction control block 18 makes a comparison between the levels of audio signals in a predetermined period for each channel. Then, while maintaining a ratio of the level of the audio signal on one channel to the level of the audio signal on the channel having the higher audio signal level, the correction control block 18 makes the audio signal correction block 16 adjust the level of the audio signal on that one channel. Consequently, the balance between the signal levels on the left and right channels can be maintained, thereby enhancing user's stereo effect.

It is also practicable to supply a recording media containing the program codes of software for realizing the functions of the above-mentioned first and second embodiments to the system or the apparatus. In addition, it is apparent that these functions can also be realized by making the computer (or a control apparatus such as a CPU) of the system or the apparatus read the programs codes stored in the recording media.

The recording media for supplying programs codes in the above-mentioned case may include floppy disk, hard disk drive, optical disk, magneto-optical disk, CD-ROM, CD-R, magnetic tape, nonvolatile memory card, and ROM, for example.

Further, executing program codes read by the computer from the recording media realizes the functions of the above-mentioned embodiments. In addition, on the basis of instructions by the above-mentioned program codes, the OS (Operating System) or the like operating on the computer executes all or part of actual processing. By this processing, the functions of the above-mentioned embodiments may also be realized.

While preferred embodiments of the present invention have been described using specific terms, such description is for illustrative purpose, and it is to be understood that changes and variations may be made without departing from the spirit or scope of the following claims.

It should be understood by those skilled in the art that various modifications, combinations, sub-combinations and alterations may occur depending on design requirements and other factor in so far as they are within the scope of the appended claims or the equivalents thereof.

What is claimed is:

1. A recording apparatus comprising:
an audio signal correction block configured to execute correction for flattening the frequency characteristic of an audio signal supplied from a microphone and correction of the level of said audio signal on the basis of a recording mode in which correction amounts of the frequency characteristic and the level of said audio signal are defined;
a correction control block configured, if, on the basis of a lower limit value and an upper limit value of a target value predetermined for said recording mode, the level of said audio signal is lower than the lower limit value of said target value, to make said audio signal correction block adjust the level of said audio signal so as for the level of said audio signal to exceed the lower limit value of said target value, if the level of said audio signal is over the upper limit value of said target value, make said audio signal correction block adjust the level of said audio signal so as for the level of said audio signal to go below the upper limit value of said target value, by use of an absolute value of the level of said audio signal that is maximized in a predetermined period as a reference value, attenuate said reference value with time, and, if an audio signal with a level thereof exceeding said reference value is entered, use the absolute value of the level of said audio signal exceeding said reference value as a new reference value; and
a recording block configured to record said audio signal to a recording media,
wherein said audio signal correction block cuts an ultra low range, said ultra low range being lower than an audible band and may cause or contain noise, from said audio signal to flatten the level of said audio signal in an audible range and said correction control block makes an attenuation amount per certain time of said reference value variable in accordance with the level of said audio signal and causes a speed of the correction of the level of said audio signal to be executed by said audio signal correction block to be variable.

2. The recording apparatus according to claim 1, wherein, if said audio signal of each of a plurality of channels is supplied, said correction control block makes a comparison between the levels of the audio signals in a predetermined period for each of said plurality of channels and, while maintaining a ratio of the level of said audio signal of a first channel to a level of an audio signal of a second channel with the level of said audio signal being higher, makes said audio signal correction block adjust the level of said audio signal of said first channel.

3. The recording apparatus according to claim 2, wherein, after a first recording mode providing a reference of a sensitivity of said microphone is defined, said recording mode is one of a second recording mode for raising the sensitivity of said microphone over said first recording mode, a third recording mode for lowering the sensitivity of said microphone below said first recording mode, and a fourth recording mode for correcting the level of said audio signal while maintaining a state of the frequency characteristic of said audio signal picked up by said microphone.

4. The recording apparatus according to claim 3, further comprising a selection block configured to select an audio signal supplied from said microphone that is not processed at all or an audio signal adjusted via said audio signal correction block and output the selected digital audio signal.

5. A recording method comprising the steps of:
correcting an audio signal supplied from a microphone to flatten a frequency characteristic of said audio signal and a level of said audio signal on the basis of a recording mode in which correction amounts of the frequency characteristic and the level of said audio signal are defined;
adjusting, if, on the basis of a lower limit value and an upper limit value of a target value predetermined for said recording mode, the level of said audio signal is lower than the lower limit value of said target value, the level of said audio signal so as for the level of said audio signal to exceed the lower limit value of said target value and adjusting, if the level of said audio signal is over the upper limit value of said target value, the level of said audio signal so as for the level of said audio signal to go below the upper limit value of said target value;
setting an absolute value of the level of said audio signal that is maximized within a predetermined period, attenuating said reference value in accordance with a passing of time, and, if an audio signal having the level of said audio signal exceeding said reference value is entered, setting an absolute value of the level of said audio signal exceeding said reference value as a new reference value; and
recording said audio signal to a recording media,
wherein said correction step cuts a band lower than the audible band that causes a noise from said audio signal; flattens a level of said audio signal in the audible range; and
said correction control block makes an attenuation amount per constant time of said reference value variable in accordance with a level of said audio signal and makes a speed of correcting the level of said audio signal to be executed by said audio signal correction block variable.

6. The recording method according to claim 5, wherein, if said audio signal of each of a plurality of channels is supplied, said reference value setting step makes a comparison between the levels of the audio signals in a predetermined period for each of said plurality of channels and, while maintaining a ratio of the level of said audio signal of a first channel to a level of an audio signal of a second channel with the level of said audio signal being higher, makes said audio signal correction block adjust the level of said audio signal of said first channel.

7. The recording method according to claim 6, wherein, after a first recording mode providing a reference of a sensitivity of said microphone is defined, said recording mode is one of a second recording mode for raising the sensitivity of said microphone over said first recording mode, a third recording mode for lowering the sensitivity of said microphone below said first recording mode, and a fourth recording mode for correcting the level of said audio signal while maintaining a state of the frequency characteristic of said audio signal picked up by said microphone.

* * * * *